US 6,537,866 B1

(12) United States Patent
Shields et al.

(10) Patent No.: US 6,537,866 B1
(45) Date of Patent: Mar. 25, 2003

(54) METHOD OF FORMING NARROW INSULATING SPACERS FOR USE IN REDUCING MINIMUM COMPONENT SIZE

(75) Inventors: Jeffrey A. Shields, Sunnyvale, CA (US); Tuan D. Pham, San Jose, CA (US); Jusuke Ogura, Cupertino, CA (US); Bharath Rangarajan, Santa Clara, CA (US); Simon Siu-Sing Chan, Saratoga, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/691,643

(22) Filed: Oct. 18, 2000

(51) Int. Cl.[7] .............................................. H01L 21/338
(52) U.S. Cl. ...................... 438/183; 438/230; 438/780; 438/197; 438/585; 438/412; 430/14; 430/18; 430/313
(58) Field of Search .................. 438/780, 623, 438/230, 705, 734, 739, 291, 299, 301, 197, 199, 585, 303, 595, 589, 287, 412, 494, 498, 504, 669, 717, 759, 736, 183, 707; 430/14, 18, 313, 317, 325

(56) References Cited

U.S. PATENT DOCUMENTS

| 4,770,897 | A | * | 9/1988 | Wu | 437/228 |
|---|---|---|---|---|---|
| 5,120,622 | A | * | 6/1992 | Hanrahan | 430/7 |
| 5,476,802 | A | * | 12/1995 | Yamazaki et al. | 437/21 |
| 5,605,864 | A | | 2/1997 | Prall | 437/195 |
| 5,677,218 | A | | 10/1997 | Tseng | 437/45 |
| 5,776,821 | A | * | 7/1998 | Haskell et al. | 438/585 |
| 5,786,256 | A | | 7/1998 | Gardner et al. | 438/305 |
| 5,866,473 | A | * | 2/1999 | Xiang et al. | 438/585 |
| 5,876,879 | A | * | 3/1999 | Klienhenz et al. | 430/5 |
| 5,918,132 | A | | 6/1999 | Qian et al. | 438/299 |
| 5,965,461 | A | | 10/1999 | Yang et al. | 438/717 |
| 6,022,815 | A | * | 2/2000 | Doyle et al. | 438/947 |
| 6,103,559 | A | * | 8/2000 | Gardner et al. | 438/183 |
| 6,218,078 | B1 | * | 4/2001 | Iacaponi | 430/313 |
| 6,255,182 | B1 | * | 7/2001 | Wieczorek et al. | 438/305 |
| 6,306,560 | B1 | * | 10/2001 | Wang et al. | 430/316 |
| 6,316,166 | B1 | * | 11/2001 | Chi et al. | 430/313 |
| 6,365,327 | B1 | * | 4/2002 | Chittipeddi et al. | 430/313 |

OTHER PUBLICATIONS

Templeton et al. U.S. patent application Publication US 2001/0045648–A1.*

* cited by examiner

Primary Examiner—Wael Fahmy
Assistant Examiner—Fernando Toledo

(57) ABSTRACT

A method for forming insulating spacers for separating conducting layers in semiconductor wafer fabrication. The spacers are formed by removing portions of a protective photoresist layer through photolithography, and then through etching of exposed portions of the insulating layer. The spacers allow for fabrication of components that are smaller in size than are obtainable through conventional photolithography methods.

21 Claims, 23 Drawing Sheets

METHOD OF FORMING NARROW INSULATING SPACERS FOR USE IN REDUCING MINIMUM COMPONENT SIZE

BACKGROUND

The present invention pertains to the field of integrated circuit device manufacturing processes. More particularly, this invention relates to a method of forming narrow spacers or spaces in semiconductor devices for use in forming components of reduced size.

The size of components on semiconductor wafers is typically limited by the resolution of the optical lithography printing system. In an optical lithography printing system, radiation is directed from an illuminating source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of these diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of the lens depends on the wavelength of the illumination source and the numerical aperture of the lens.

As process technologies approach and surpass the resolvable limits of current lithography systems, it is has become increasingly difficult to create the narrow spaces that are now required in semiconductor fabrication processes. Many of the current photolithography systems in use have difficulty creating spaces smaller than 0.2 microns. However, by minimizing the area required for a given component, the number of components available for a given area of silicon increases, and with it a corresponding increase in the circuit complexity that can be achieved on a given area of silicon. Thus, decreasing the size of various components of semiconductor devices allows for more components to be formed on a single silicon wafer, leading to substantial savings in the fabrication costs of semiconductor devices.

Therefore, it would be desirable to have a manufacturing process that permits the reproducible fabrication of semiconductor device components having critical dimensions that are smaller than the minimum resolvable feature of current photolithography systems.

SUMMARY

The present invention solves the problem of overcoming the resolution limits of conventional photolithography when patterning small or narrow spaces in semiconductor devices. To allow for very small separations between conducting portions, small insulating spacers are formed which separate conducting portions.

In one aspect of the invention, a method for reducing the minimum size of a component is provided. The method includes forming one or more insulating spacers on a surface of a semiconductor wafer, the spacers having a lateral width less than the minimum width resolvable by a photolithography system.

In another aspect of the invention, a method is provided for forming at least one insulating spacer on a semiconductor structure. The method includes providing a semiconductor structure having a substrate, an insulating layer on the substrate, the insulating layer having one or more exposed portions and one or more unexposed portions, and a photoresist layer covering the one or more unexposed portions of the insulating layer. The exposed portion of the insulating layer is isotropically etched in order to form one or more insulating spacers, each spacer having a lateral width less than a minimum width resolvable by a photolithography system.

In yet another aspect of the invention, a method is provided for forming at least one insulating spacer on a semiconductor structure. The method includes providing a semiconductor structure having a substrate, an insulating layer on the substrate, the insulating layer having one or more exposed portions and one or more unexposed portions, and a photoresist layer covering said one or more unexposed portions of the insulating layer. The lateral width of the photoresist layer is then trimmed, thereby widening the exposed portion of the insulating layer. The exposed portion of the insulating layer is then etched in order to form one or more insulating spacers, each spacer having a lateral width less than a minimum width resolvable by a photolithography system.

In another aspect of the invention, a method is provided for forming small components on a semiconductor wafer. The method includes forming one or more insulating spacers on a surface of a semiconductor structure, where the insulating spacers having a lateral width less than a minimum width resolvable by a photolithography system. A conducting layer is then deposited over the one or more spacers. Finally, a component is formed from the conducting layer.

In yet another aspect of the present invention, a method is provided for removing a narrow spacer from a semiconductor structure. The method includes providing a semiconductor structure having one or more insulating spacers adjacent one or more conductors, wherein the one or more spacers are formed from a spacer material that will evaporate at an evaporative temperature below a temperature that will damage the one or more conductors. The semiconductor structure is then heated to evaporate the one or more spacers and thereby remove them from the semiconductor structure.

It should be appreciated that for simplicity and clarity of illustration, elements shown in the Figures have not necessarily been drawn to scale. For example, dimensions of some of the elements are exaggerated relative to each other for clarity.

DETAILED DESCRIPTION

Those skilled in the art will appreciate that the novel method described herein includes many conventional process steps that are well known in the art of semiconductor device fabrication. The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997.

Figure 1:
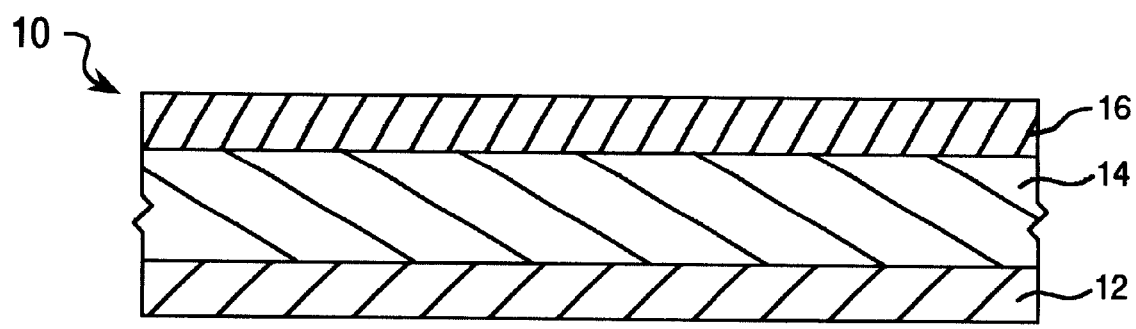
FIG. 1 is a partial cross-sectional view of a semiconductor structure upon which an insulating spacer is formed according to an embodiment of the present invention.

FIG. 1 is a partial cross-sectional view of a semiconductor structure 10, such as a semiconductor wafer. The structure 10 includes a substrate 12, typically made from silicon or a silicon-containing material. In a conventional process sequence not shown in the figures, an insulating layer 14 is formed upon the upper surface of substrate 12. The insulating layer 14 typically is either an oxide or nitride layer or a combination of oxide and nitride. In a presently preferred embodiment, the insulating layer 14 is formed from either silicon dioxide or silicon nitride. In especially preferred embodiments, the insulating layer 14 is made from a material that will evaporate at temperatures below a temperature at which components, such as conductors, would be damaged. Suitable materials having this property are described in more detail below.

Preferably, insulating layer 14 has a thickness that is slightly greater than the desired thickness of a conducting layer that will later be formed on the substrate 12 in place of or adjacent to the insulating layer 14. For example, if a 2000 Å conducting layer is desired, then the insulating layer 14 typically will be anywhere from 2300–2500 Å. It is necessary for the insulating layer 14 to be thicker than the desired thickness of the conducting layer because subsequent etching and polishing of the insulating layer during the process will thin the insulating layer 14.

After the formation of the insulating layer 14, a layer of photoresist 16 is deposited on the upper surface of the insulating layer 14, using methods well known in the art. Preferably, the photoresist layer 16 has a thickness of about 5000 Å to about 15000 Å.

Figure 2:
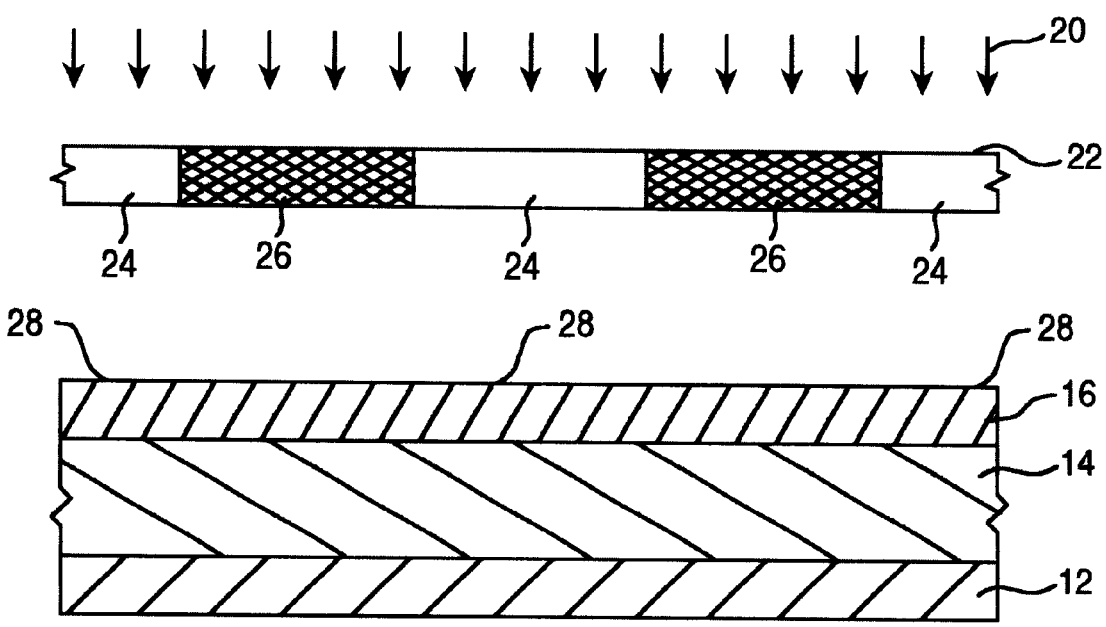
FIG. 2 is a partial cross-sectional view illustrating a photolithography process being performed on the structure of FIG. 1.

As shown in FIG. 2, photoresist layer 16 is then selectively exposed to radiation 20 through a photomask 22 having transmissive regions 24 and non-transmissive regions 26. This photolithography process results in exposed regions 28 within the photoresist layer 16 corresponding to the transmissive regions 24 of the photomask 22. In the embodiment shown, a positive photoresist technique has been used, however, those skilled in the art will appreciate that a negative photoresist technique could be used equally as well.

Figure 3:
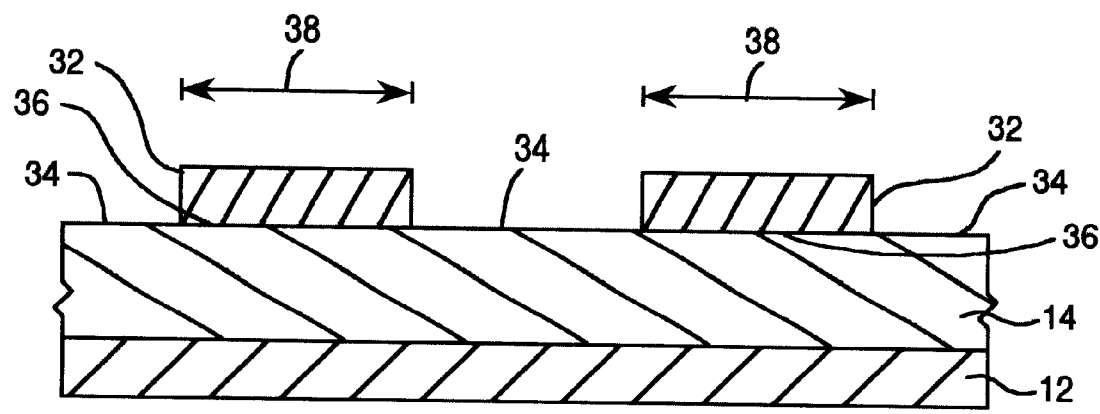
FIG. 3 is a partial cross-sectional view the semiconductor structure resulting from the photolithography process of FIG. 2.

As shown in FIG. 3, the exposed regions 28 (FIG. 2) photoresist layer 16 have been softened and removed, thereby forming a pattern of protective photoresist portions 32 from the remaining photoresist layer 16, and also forming exposed portions 34 on the upper surface of the insulating layer 14. In the preferred embodiment, the lateral width 38 of the protective photoresist portions 32, and consequently of the unexposed portions 36 of the insulating layer 14, is substantially equal to or slightly greater than the minimum width resolvable by the photolithography system used to create the protective pattern from the photoresist layer 16. In most conventional photolithography systems, this minimum lateral width is about 0.2 microns.

Figure 4A:
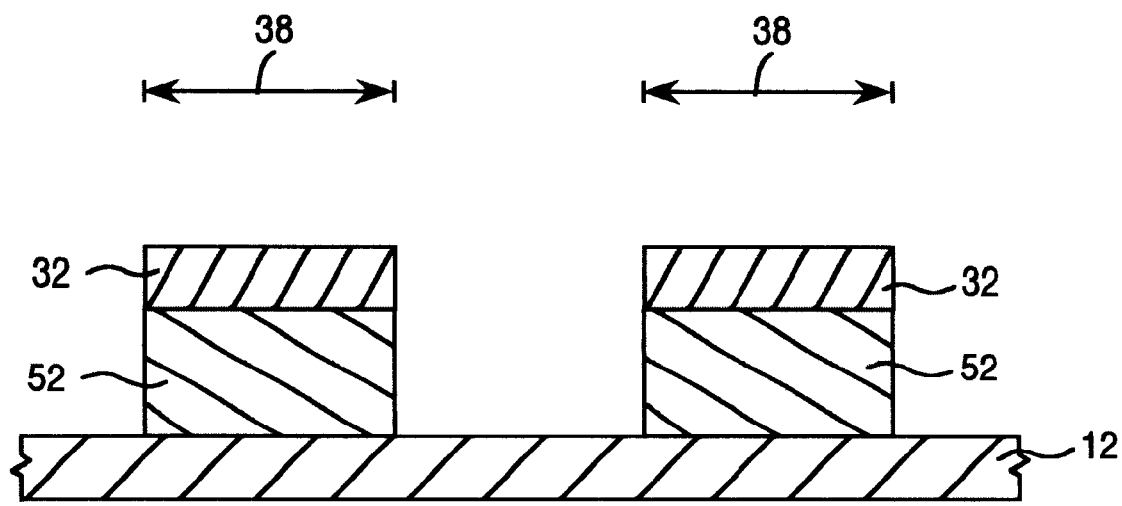
FIG. 4A–FIG. 4D illustrate one embodiment of a process of forming a spacer from the structure of FIG. 3.
Figure 4B:
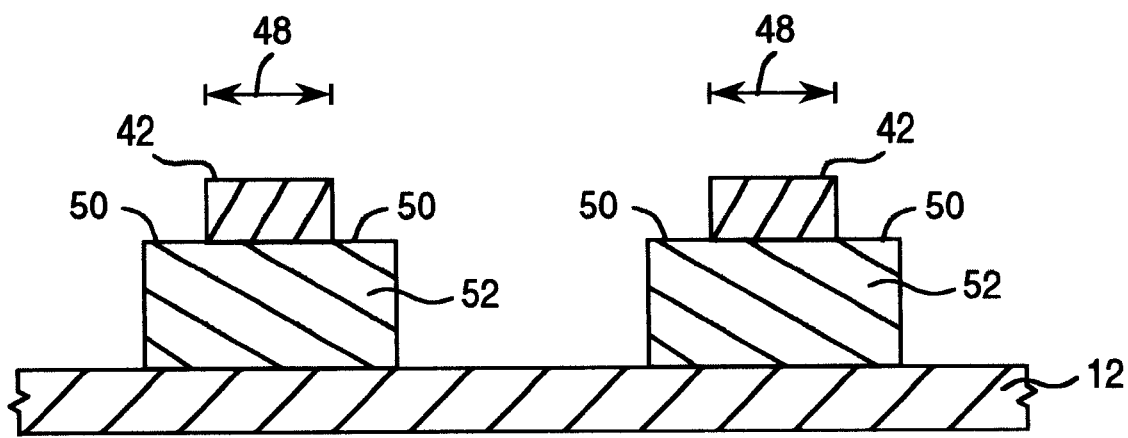
Figure 4C:
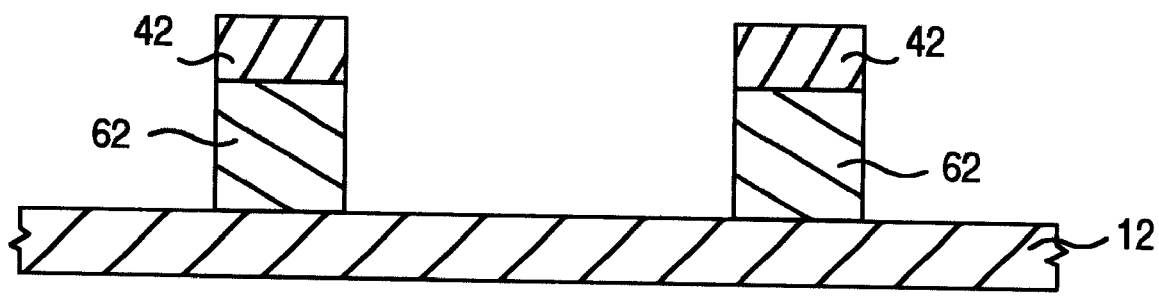

To form a spacer in the insulating layer 14 having a lateral width less than this minimum resolvable width, one of four preferred processes is employed. One such process is shown in FIGS. 4A–4D. In this process, the exposed portions 34 of the insulating layer (FIG. 3) are anisotropically etched by conventional methods, resulting in the structure as shown in FIG. 4A. The unexposed portions 36 (FIG. 3) of the insulating layer remain intact, resulting in insulating pillars 52. These pillars 52 of insulating material also have the same lateral width 38 as the protective photoresist portions 32. Next, the remaining protective photoresist portions 32 are further trimmed resulting in the structure as shown in FIG. 4B. The photoresist cap 42 has a resulting lateral width represented by arrow 48 that is less than the minimum width resolvable by the photolithography used to create the pattern in the photoresist layer 16 (as shown in FIGS. 2–3). A preferred method for trimming the photoresist portions 32 is disclosed in U.S. Pat. No. 5,965,461, entitled "Controlled Linewidth Reduction During Gate Pattern Formation Using a Spin-On BARC," the entire disclosure which is incorporated herein by reference. After the photoresist is trimmed, the exposed portions 50 of the insulating pillars 52 are subjected to further anisotropic etching. The resulting spacers 62, shown in FIG. 4C, like photoresist caps 42, have lateral widths 48 equal to or less than the minimum resolvable width. In preferred embodiments of the present invention, the lateral width 48 is less than about 0.2 microns. In more preferred embodiments of the present invention, the lateral width 48 is less than about 0.15 microns. In even more preferred embodiments, the lateral width 48 is less than about 0.1 microns.

Before further processing, the remaining photoresist caps 42 are removed, preferably through a stripping process. Both wet and dry methods that are well known in the art can be used to strip the remaining photoresist caps 42. Such methods include but are not limited to use of sulfuric acid and oxidant solutions, and conventional $O_2$ plasma stripping.

Figure 4D:
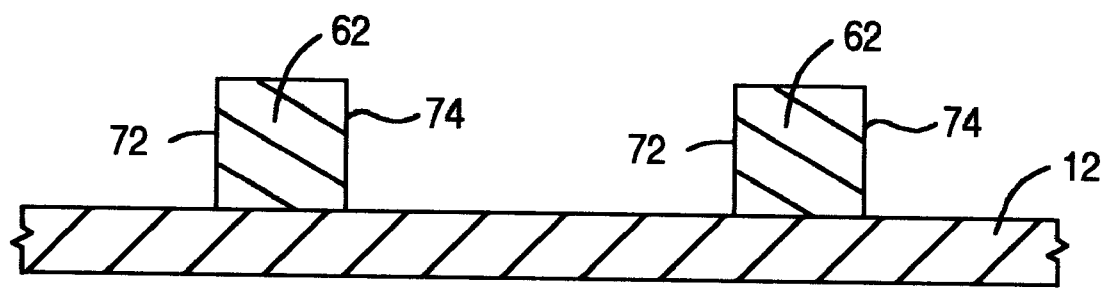

The structure resulting from the stripping process is shown in FIG. 4D. The structure includes the substrate 12 and spacers 62. In the preferred embodiment shown, spacers 62 have generally vertical sides 72, 74, and are free-standing. As used herein, "free-standing" means that the spacers 62 are not supported or attached to other components on their sides 72, 74, or at any other portion other than at their bottom surface.

Figure 5A:
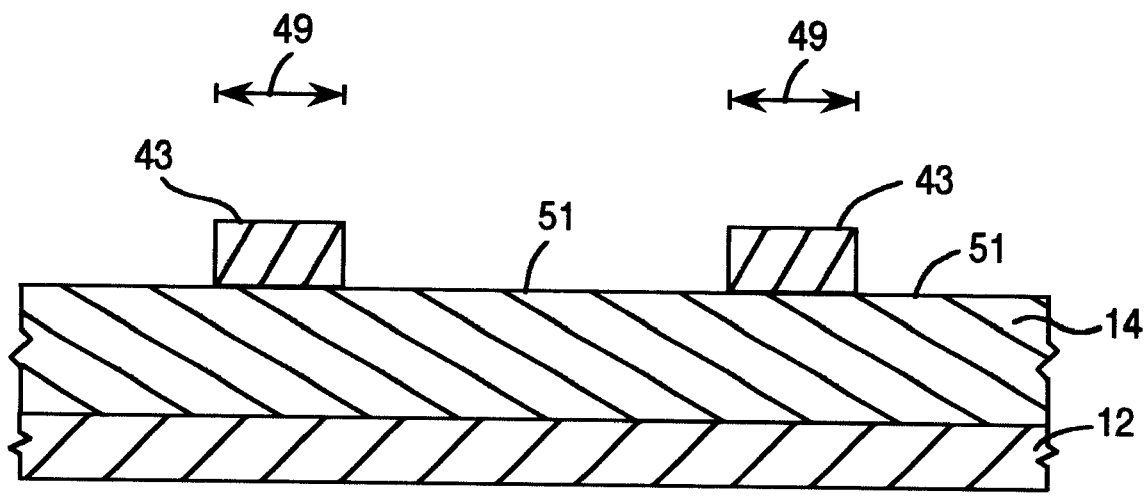
FIG. 5A–FIG. 5C illustrate an alternate embodiment of a process for forming a spacer from the structure of FIG. 3.
Figure 5B:
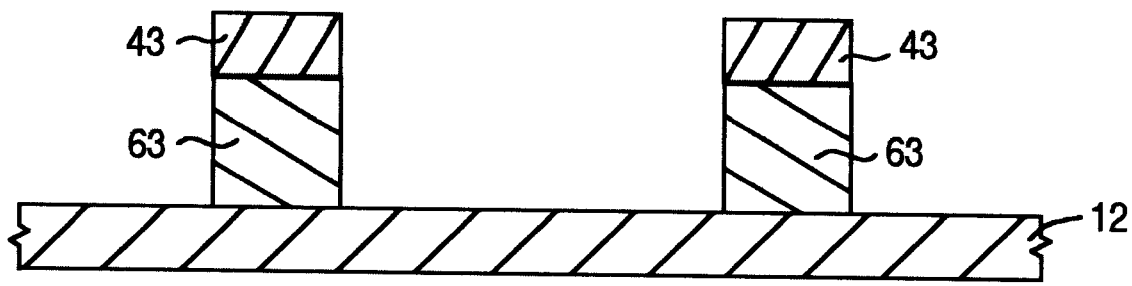
Figure 5C:
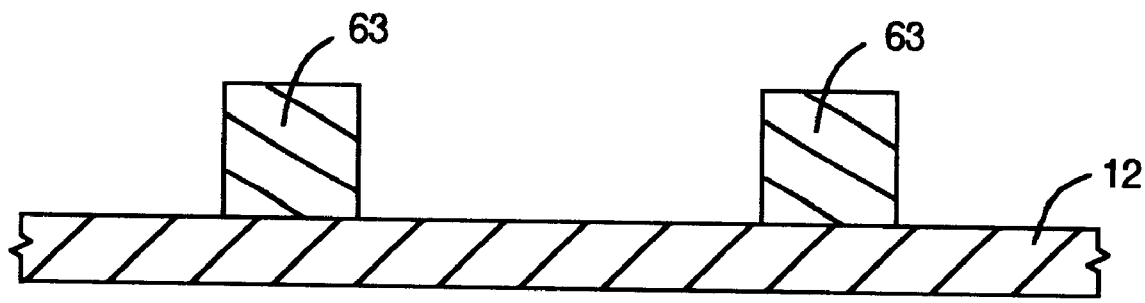

In an alternate embodiment, shown in FIGS. 5A–5C, the protective photoresist portions 32 are trimmed before any etching of the insulating layer 14. In this embodiment, the protective photoresist portions 32 of FIG. 3 are trimmed immediately after exposing the photoresist layer 16 to a photolithography process. The resulting structure, shown in FIG. 5A, has a photoresist cap 43 with a lateral width (represented by arrow 49) that is less than the minimum width resolvable by a photolithography process. The exposed portions 51 of the insulating layer 14 are then anisotropically etched. The resulting spacers 63, shown in FIG. 5B, like photoresist caps 43, have lateral widths 49 equal to or less than the minimum resolvable width. The photoresist caps 43 may then be removed by a conventional stripping process, resulting in the structure of FIG. 5C. This alternate embodiment simplifies the process by eliminating the first isotropic etching.

Figure 6A:
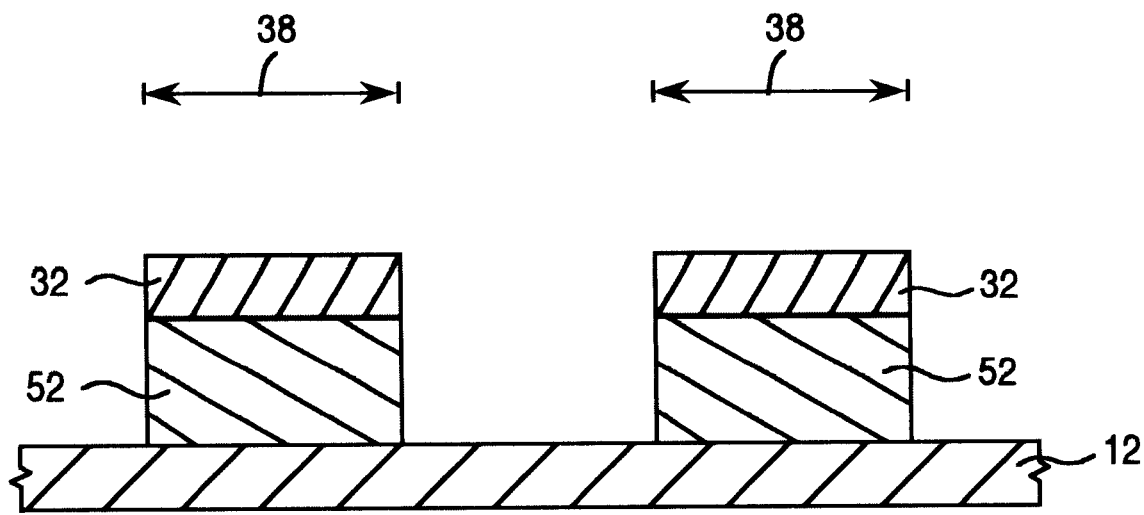
FIG. 6A–FIG. 6C illustrate an embodiment of a process for forming a spacer from the structure of FIG. 3.
Figure 6B:
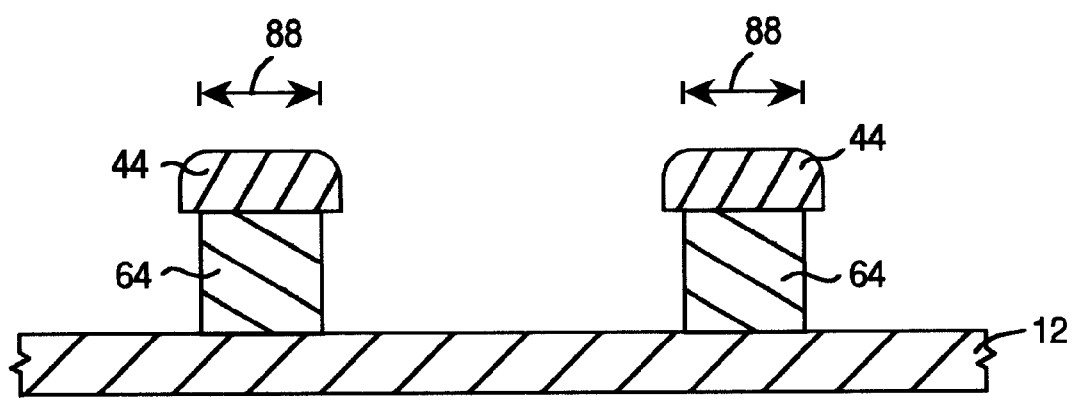
Figure 6C:
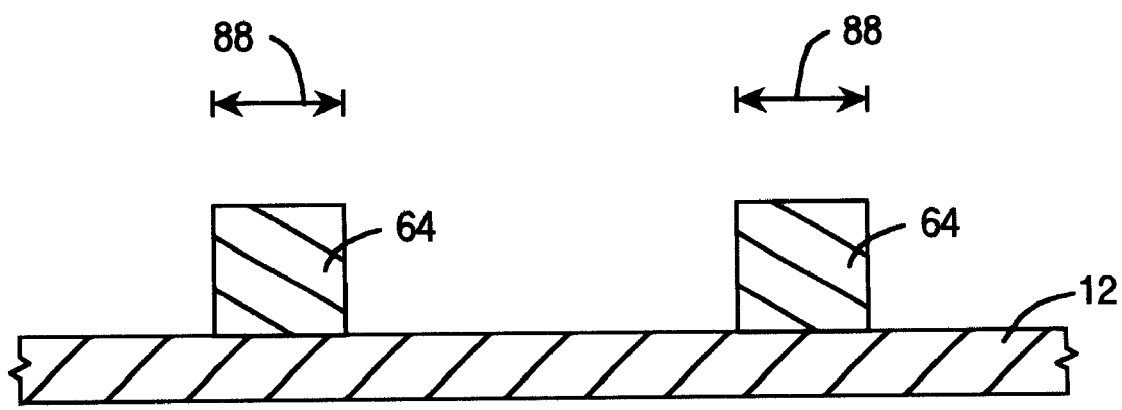

FIGS. 6A–6C illustrate an alternate embodiment of the process for forming spacers from the structure of FIG. 3. Like in the first embodiment described above with reference to FIGS. 4A–4B, the insulating layer 14 is first exposed to anisotropic etching, which removes the exposed portions 34 (FIG. 3) of the insulating layer 14, while leaving the unexposed portions 36 intact, resulting in pillars 52 as shown in FIG. 6A. These pillars 52 of insulating material also have the same lateral width 38 as the protective photoresist portion 32. The insulating layer 14 is then exposed istoroic etching, which removes a portion of the unexposed portion of the insulating pillar 52, resulting in a spacer 64 as shown in FIG. 6B. As also shown in FIG. 6B, the isotropic etching may remove or round portions of the photoresist cap 44. The spacer 64 formed in the insulating layer has a lateral width 88 less the minimum resolvable width obtainable using a conventional photolithography system.

Those skilled in the art will recognize that isotropic etching can be brought about by controlling the etchant strength, etching temperature, and etching time. The isotropic etch can be either a wet or dry etch. Preferably, the isotropic etch is a wet etch. Presently preferred wet etches include hydrofluoric acid or buffered oxide etches for dielectric oxide layers and phosphoric acid or hydrofluoric etches for dielectric nitride layers. Presently preferred dry etches for both oxide and nitride layers include plasma etches with a flourine based system.

Photoresist cap 44 may then removed by conventional photoresist stripping, resulting in the structure shown in FIG. 6C. The structure includes the substrate 12 and spacers 64. In the preferred embodiment shown, spacers 64 are free-standing. It is noted that the photoresist cap 44 may be removed before the isotropic etching, although this may result in more rounding and shortening of the top surface of the spacer 64.

Figure 7A:
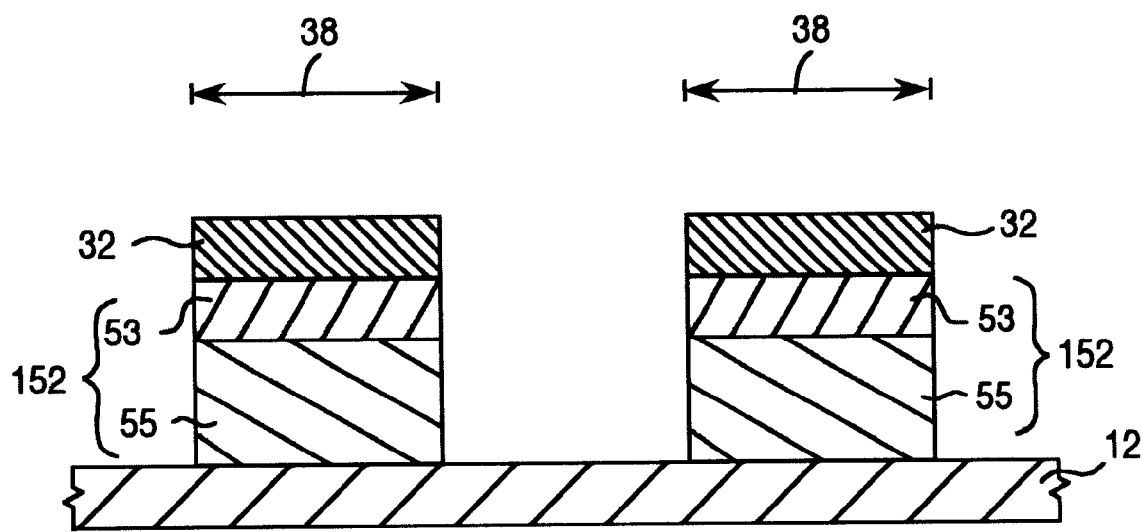
FIG. 7A–FIG. 7D illustrate an alternate embodiment of a process for forming a spacer from a structure similar to the structure of FIG. 3.
Figure 7B:
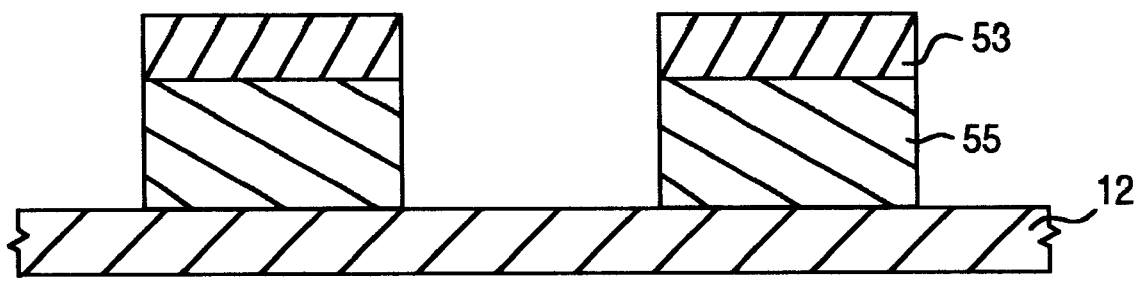

FIGS. 7A–7D illustrate yet another preferred embodiment of a process for forming a spacer on a semiconductor structure. FIG. 7A shows a structure similar to that of FIG. 4A or 6A, but has a modified insulating layer 152. The insulating layer 152 of this embodiment includes two sub-layers, formed in an earlier conventional process not shown. The first sub-layer 53 is made from a first material, while the second sub-layer 55 is made from a second material distinct from the first material. The first and second materials are chosen so that the two materials can be selectively etched, as more fully described below. In the preferred embodiment, one of the sub-layers is formed from an oxide, while the other sub-layer is formed from a nitride.

Figure 7C:
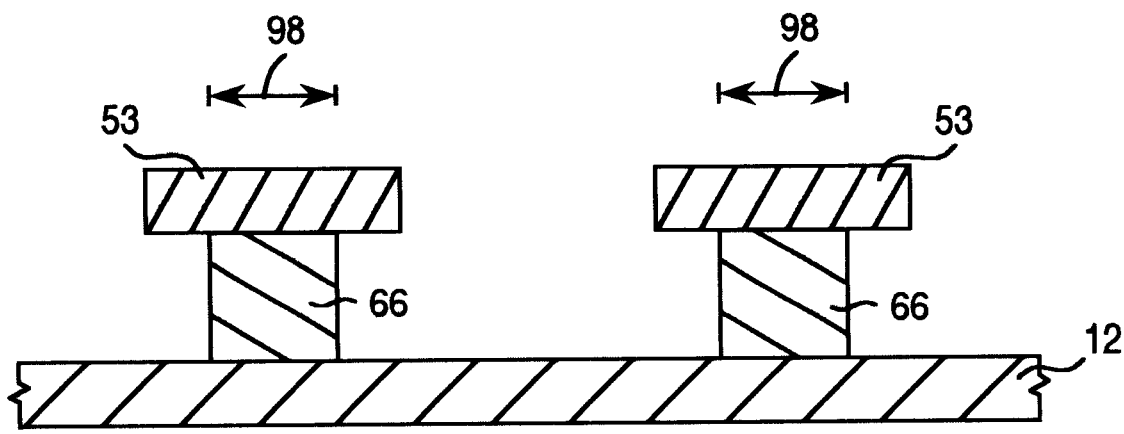
Figure 7D:
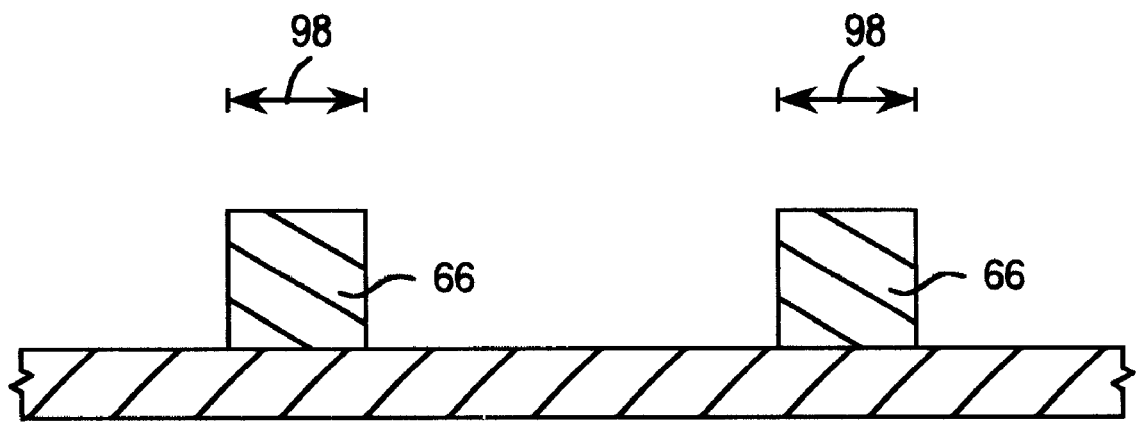

The structure in FIG. 7A results from an etching step that is non-selective to the first and second material, that is, the etchant is chosen for its ability to remove both the first and second sub-layer substantially equally. Next, the protective photoresist portions 32 are stripped using conventional stripping techniques, resulting in the structure shown in FIG. 7B. Then a selective etching step is used to remove portions of the second sub-layer 55, but leaving the first sub-layer 53 substantially intact. This selective etching step forms spacers 66 in the second sub-layer 55 that have a lateral width 98 less the minimum resolvable width obtainable using a conventional photolithography system, as shown in FIG. 7C. Finally, another etchant, selective for the material of the first sub-layer 53, is used to remove the first sub-layer 53, yet leaving the spacers 66 intact, resulting in the structure shown in FIG. 7D. The structure includes the substrate 12 and the spacers 66. In the preferred embodiment shown, the spacers 66 are free-standing.

The process of FIGS. 7A–7D is especially advantageous because the "hard cap" defined by the first sub-layer 53 helps prevent shortening or rounding of the spacers 66 formed in the second sub-layer 55. Those skilled in the art will recognize that the process could be slightly modified to achieve the same results, such as performing the stripping of the photoresist after the selective etching of the second sub-layer.

Figure 8:
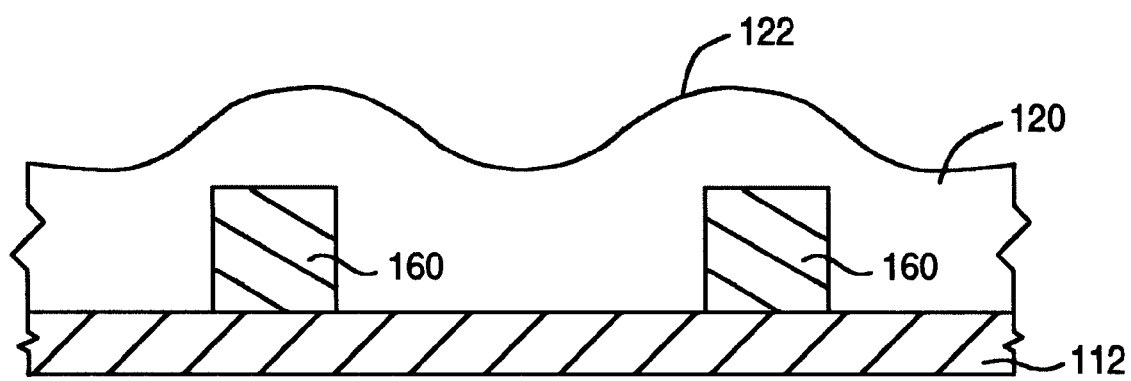
FIG. 8 is a partial cross-sectional view of the semiconductor structure of any of FIGS. 4D, 5C, 6C and 7D after a conducting layer has been deposited thereon.
Figure 9:
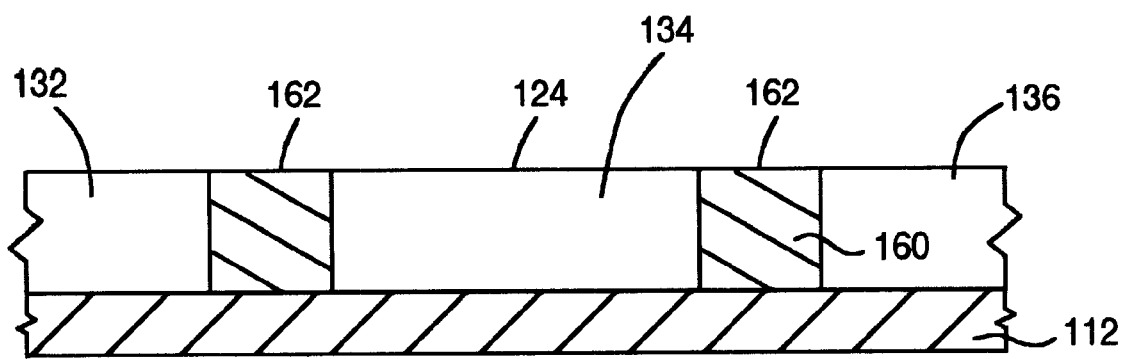
FIG. 9 is a partial cross-sectional view of the semiconductor structure of FIG. 8 after the conducting layer has been planarized.
Figure 10:
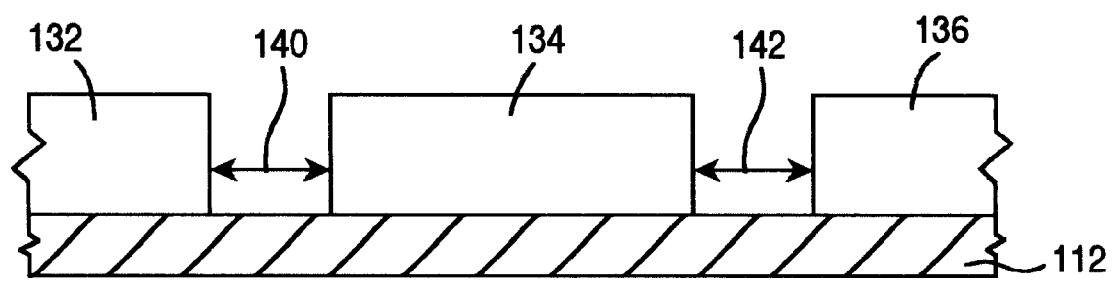
FIG. 10 is a partial cross-sectional view of the semiconductor structure of FIG. 9 after the insulating spacers have been removed.

FIGS. 8–10 illustrate how insulating spacers 160 (corresponding to spacers 62, 63, 64, and 66 of FIGS. 4D, 5C, 6C, and 7D, respectively) can be used to form small components upon a substrate 112. First, a conducting layer 120 is formed over the spacers 160, using conventional methods known in the semiconductor fabrication art, such as by vapor deposition. In a preferred embodiment, the formation of the conductive layer 120 is accomplished by blanket deposition of a layer of polysilicon. The polysilicon layer subsequently can be doped to create a more or less conductive polysilicon layer. Other suitable materials for the conductive layer include, but are not limited to, titanium nitride, titanium tungsten, aluminum, copper, or any other conductive material that can be polished and is compatible with the processing sequence disclosed herein.

The resulting conducting layer 120, shown in FIG. 8, has an uneven topography 122 because of the spacers 160 and other surface effects. The conducting layer 120 is then planarized using any technique known in the art, such as chemical mechanical polishing. Preferably, as shown in FIG. 9, the conducting layer 120 is planarized so that its upper surface 124 is substantially coplanar with the upper surfaces 162 of the spacers 160. The pattern of this resulting conducting layer, which includes separated conductors 132, 134, and 136, may be used as electrical components on the semiconductor device.

After the conducting layer 120 has been planarized, the spacers may or may not be left in the structure. Removal of the spacers results in the structure shown in FIG. 10. Suitable wet or dry etches well known in the art of semiconductor fabrication can be used to remove spacers 160. An especially preferred method of removing the spacers according to the present invention is through evaporation. The semiconductor structure is heated at a temperature which will evaporate the spacers, defined herein as the "evaporative temperature." In the preferred embodiment, the heating is accomplished by a furnace, a heated platen, or a heating lamp.

In order to evaporate the spacers 160 without damaging the newly formed conductors 132, 134, 136, the spacers 160 must evaporate at an evaporative temperature that is lower than a temperature at which the newly formed conductors 132, 134, and 136, or other portions of the semiconductor structure, will be damaged. Furthermore, because the spacers 160 are formed before the formation of the conducting layer used in making the conductors 132, 134, 136, the spacer material will preferably be stable at the temperature at which the conducting portions are formed. Conventionally, the conducting layer is formed by methods such as vapor deposition, and in a preferred embodiment, the spacer material will be stable at temperatures typical of vapor deposition.

In a preferred embodiment, the spacer material will be stable up to about 400–600° C., or the temperature at which the conducting layer is formed. Also in preferred embodiments, the spacer material will evaporate at about 500–1000° C. Lower evaporative temperatures are preferred, as long as the evaporative temperature is higher than the temperature at which the conducting layer is formed (i.e., higher than the vapor deposition temperature).

Preferred spacer materials include, but are not limited to, polymers of hydrocarbons. In especially embodiments, the spacer material is formed from polymers of oxygenated hydrocarbons, sulfur-containing hydrocarbons and/or nitrogen-containing hydrocarbons. An example of a suitable polymer for use as an evaporative spacer is sold under the tradename FLARE by Honeywell, Inc. of Morris Township, N.J. Especially preferred polymers are the polyimides, and among, these, most preferred are fluorine doped low dielectric constant polyimides. An example of a suitable fluorine doped low dielectric constant polyimide is sold under the tradename FPI-136M by Schumacher of Carlsbad, Calif.

The process as described above is generally applicable to the formation of any components in semiconductor fabrication. The semiconductor structure of the present invention may be incorporated into a semiconductor device such as an integrated circuit, for example a memory cell such as an SRAM, a DRAM, an EPROM, an EEPROM, non-volatile memory device, etc.; a programmable logic device; a data communications device; a clock generation device; etc. Furthermore, any of these semiconductor devices may be incorporated in an electronic device, for example a computer, an airplane, a mobile telephone or an automobile.

Figure 11:
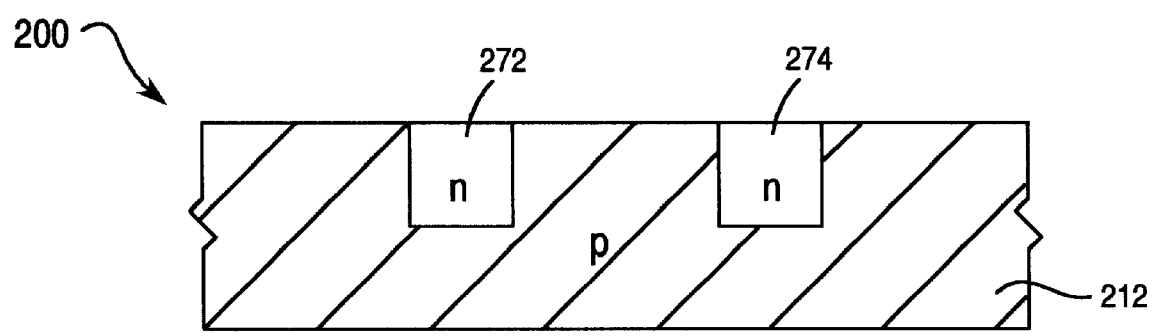
FIG. 11 is a partial cross-sectional view of a semiconductor structure that can be formed into a transistor using one preferred embodiment of the present invention.
Figure 12:
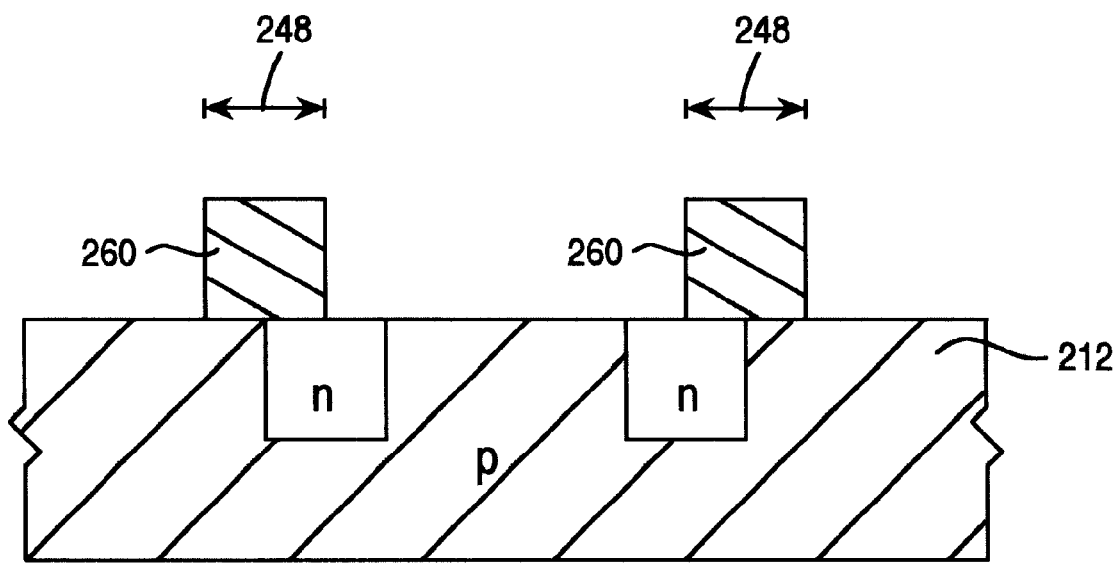
FIG. 12 is a partial cross-sectional view of the semiconductor structure of FIG. 11 after narrow spacers have been added thereto.
Figure 13:
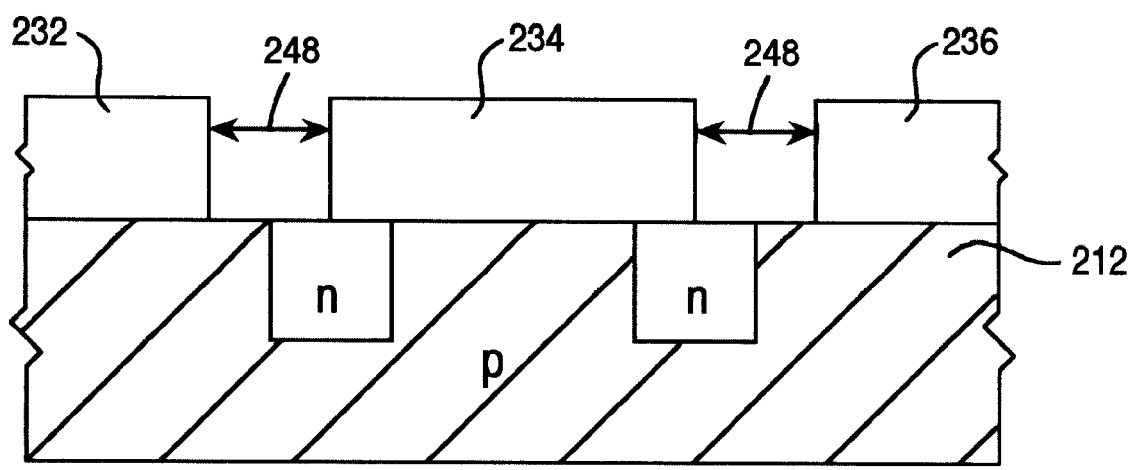
FIG. 13 is a partial cross-sectional view of the semiconductor structure of FIG. 12 that has been transformed into a transistor according to a preferred embodiment of the present invention.

One preferred application of the method is for the formation of transistor gates, as illustrated in FIGS. 11–13 and as described below. FIG. 11 illustrates a semiconductor structure 200 having a substrate 212. The substrate 212 shown is a P-type silicon wafer, but those skilled in the art will appreciate that the method could be applied to other substrates as well. The substrate 212 has two regions 272, 274 that are N-type doped according to conventional procedures known in the art.

Spacers 260 are added to the substrate 212, preferably using one of the methods above with reference to FIGS. 4–6. The resulting structure is shown in FIG. 12. The spacers 260 have been placed to allow for correct positioning of the conducting layer to be formed between the spacers 260. FIG. 13 shows the structure after the conducting layer has been deposited, planarized, and the spacers 260 have been removed, using the method of the present invention. Portion 234 of the conducting layer defines a transistor gate of the newly formed transistor that includes N-type doped regions 272, 274. The narrow lateral width of the spacers 260 allows the gate 234 to be separated from the other portions 232, 236 of the conducting layers by only this same small lateral width 248. The close proximity of the portions 232, 234, and 236 allows more components to be placed upon the substrate 212.

Thus, there has been disclosed in accordance with the invention a process for forming narrow insulating spacers that fully provides the advantages set forth above. Although the invention has been described and illustrated with reference to specific illustrative embodiments thereof, it is not intended that the invention be limited to those illustrative embodiments. For example, the method of the present invention can be used in formation of other electrical components, or in other fabrication strategies, such as in back-end interconnect applications.

Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A method for forming an insulating structure on a semiconductor substrate, comprising:
    forming an insulating layer on a semiconductor substrate;
    depositing a layer of photoresist on said insulating layer;
    using a photolithography system to remove portions of said layer of photoresist to produce exposed and unexposed portions of said insulating layer, wherein the lateral width of the photoresist layer is equal to or greater than the minimum width resolvable by said photolithography system;
    anisotropically etching said exposed portions of said insulating layer;
    trimming said layer of photoresist to expose first additional portions of said insulating layer;
    anisotropically etching said first additional portions of said insulating layer; and
    removing the remaining portions of said photoresist layer depositing a conductive layer to cover said insulating layer, planarizing the surface of said conductive layer and exposing second additional portions of said insulating layer.

2. The method of claim 1, wherein said insulating layer comprises at least one material from the group consisting of silicon dioxide and silicon nitride.

3. The method of claim 2, further comprising removing said second additional portions of said insulating layer.

4. The method of claim 3, wherein said second additional portions are removed by etching.

5. The method of claim 4, wherein said second additional portions are removed by evaporation.

6. The method of claim 5, wherein said insulating layer comprises polymers of hydrocarbons.

7. The method of claim 5, wherein said insulating layer comprises a material having an evaporative temperature between 500° C. and 1000° C.

8. A method for forming an insulating structure on a semiconductor substrate, comprising:
    forming an insulating layer on a semiconductor substrate;
    depositing a layer of photoresist on said insulating layer;
    using a photolithography system to remove portions of said layer of photoresist to produce exposed and unexposed portions of said insulating layer, wherein the lateral width of the photoresist layer is equal to or greater than the minimum width resolvable by said photolithography system;
    anisotropically etching said exposed portions of said insulating layer;
    isotropically etching additional portions of said insulating layer; and
    removing the remaining portions of said photoresist layer depositing a conductive layer to cover said insulating layer, planarizing the surface of said conductive layer and exposing second additional portions of said insulating layer.

9. The method of claim 8, wherein said insulating layer comprises at least one material from the group consisting of silicon dioxide and silicon nitride.

10. The method of claim 9, further comprising removing said second additional portions of said insulating layer.

11. The method of claim 10, wherein said second additional portions are removed by etching.

12. The method of claim 10, wherein said second additional portions are removed by evaporation.

13. The method of claim 12, wherein said insulating layer comprises polymers of hydrocarbons.

14. The method of claim 12, wherein said insulating layer comprises a material having an evaporative temperature between 500° C. and 1000° C.

15. A method for forming an insulating structure on a semiconductor substrate, comprising:

forming an insulating layer on a semiconductor substrate, wherein said insulating layer comprises a first sub-layer and a second sub-layer;

depositing a layer of photoresist on said insulating layer;

using a photolithography system to remove portions of said layer of photoresist to produce exposed and unexposed portions of said insulating layer, wherein the lateral width of the photoresist layer is equal to or greater than the minimum width resolvable by said photolithography system;

anisotropically etching said exposed portions of said insulating layer;

removing the remaining portions of said photoresist layer etching portions of said second sub-layer; and removing the remaining portions of said first sub-layer.

16. The method of claim 15, wherein said insulating layer comprises at least one material from the group consisting of silicon dioxide and silicon nitride.

17. The method of claim 16, further comprising removing said second additional portions of said insulating layer.

18. The method of claim 17, wherein said second additional portions are removed by etching.

19. The method of claim 17, wherein said second additional portions are removed by evaporation.

20. The method of claim 19, wherein said insulating layer comprises polymers of hydrocarbons.

21. The method of claim 19, wherein said insulating layer comprises a material having an evaporative temperature between 500° C. and 1000° C.

\* \* \* \* \*